United States Patent [19]

Cripps

[11] Patent Number: 5,329,249
[45] Date of Patent: Jul. 12, 1994

[54] HIGH EFFICIENCY RF POWER AMPLIFIER

[75] Inventor: Stephen C. Cripps, Sunnyvale, Calif.

[73] Assignee: Pacific Monolithics, Inc., Sunnyvale, Calif.

[21] Appl. No.: 136,310

[22] Filed: Oct. 13, 1993

[51] Int. Cl.$^5$ .............................................. H03F 3/191
[52] U.S. Cl. .................................... 330/302; 330/306
[58] Field of Search ................ 330/51, 277, 302, 303, 330/306

[56] References Cited

U.S. PATENT DOCUMENTS

| | | | |
|---|---|---|---|
| 3,919,656 | 11/1975 | Sokal et al. | 330/51 |
| 4,717,884 | 1/1988 | Mitzlaff | 330/251 |
| 4,743,858 | 5/1988 | Everard | 330/10 |
| 4,839,612 | 6/1989 | Akagi | 330/302 |
| 5,146,178 | 9/1992 | Nojima et al. | 330/251 |
| 5,159,287 | 10/1992 | Furutani et al. | 330/302 X |
| 5,187,580 | 2/1993 | Porter, Jr. et al. | 330/207 A |

OTHER PUBLICATIONS

D. M. Snider, "A Theoretical Analysis and Experimental Confirmation of the Optimally Loaded and Overdriven RF Power Amplifier", *IEEE Trans. Electron Devices*, vol. ED-14, No. 12 Dec. 1967, pp. 851–857.

Primary Examiner—Steven Mottola
Attorney, Agent, or Firm—Edward B. Anderson

[57] ABSTRACT

A control network operates a GaAs FET with a quiescent current closer to the maximum output current, $I_{max}$, than to zero current. An output network couples the FET to the load and is characterized as having a low impedance at a fundamental frequency and a high impedance lower than an open circuit impedance at at least the second harmonic frequency. As a result, the peak voltage on the output terminal is greater than two times the supply voltage. A preamplifier raises the level of the input signal so that it has a positive voltage peak when biased by the control network and applied to the input terminal. This overdrives the FET and produces an output current that is at the maximum output current level for a longer time during each cycle than the output current is at a minimum level. This enhances the effect of the output network to produce an output voltage spike on the FET that is several times the DC voltage. The amplifier is part of an amplifier system that also includes a switch coupled between the DC supply and the FET that is responsive to a control signal. A circuit is responsive to the input signal for generating the control signal appropriate for disconnecting the DC voltage supply from the FET when there is no input signal.

5 Claims, 3 Drawing Sheets

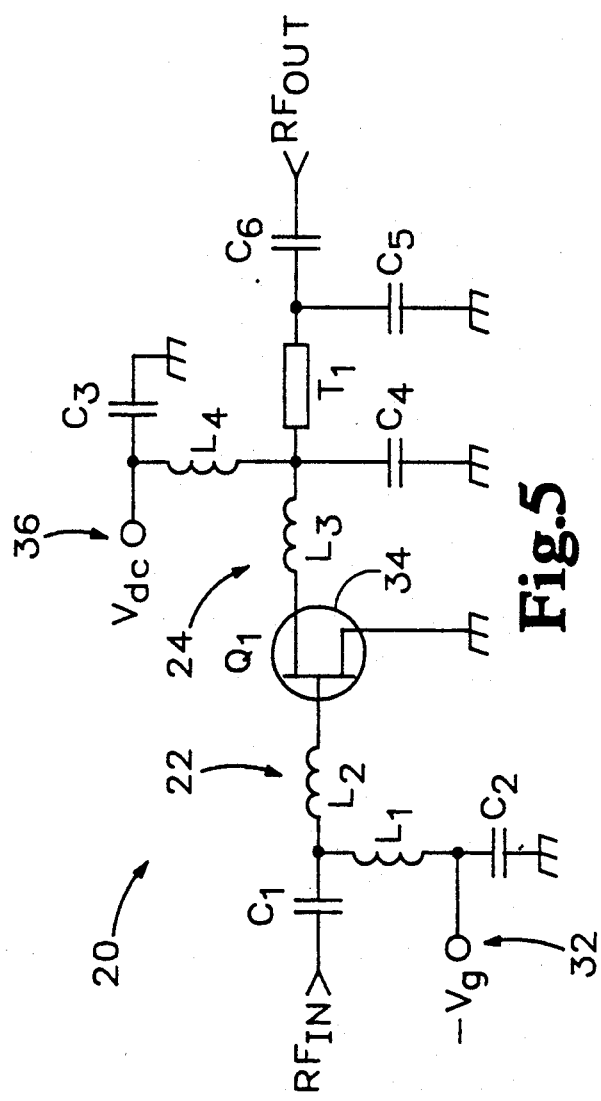
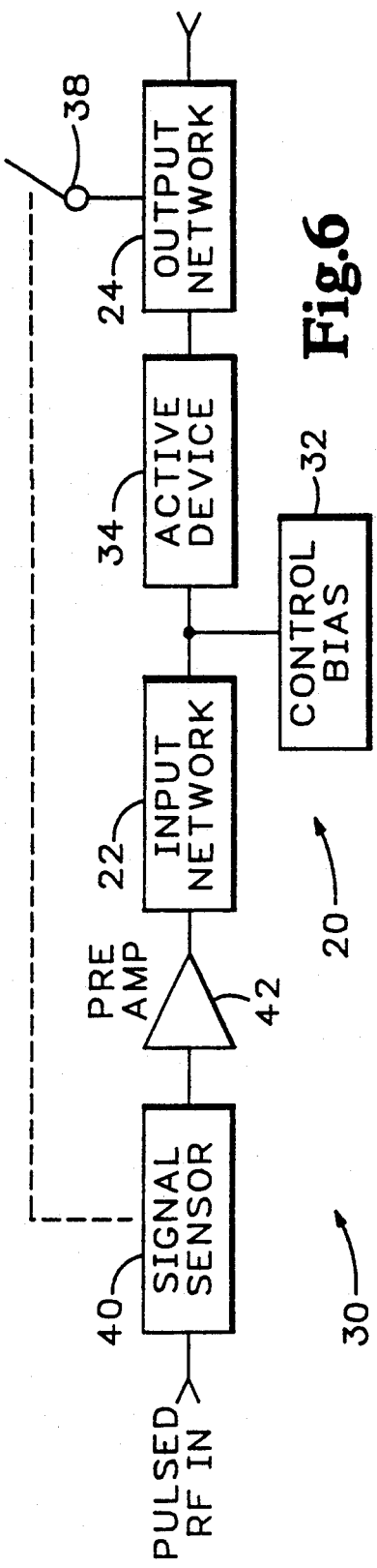

HIGH EFFICIENCY RF POWER AMPLIFIER

BACKGROUND OF THE INVENTION

1. Field of the Invention

This invention relates to RF power amplifiers, and in particular, to such amplifiers operated in a mode characterized by high quiescent-state current and highly peaked voltage at an active device output.

2. Related Art

Since the early days of vacuum tubes, RF amplifiers have been classified using the letters A, B and C, either singly or in combination. These amplifier classes have remained in common usage, in essentially unmodified form, despite a continually changing technology for electronic amplifying devices. Semiconductor devices, such as bipolar transistors, and later field effect transistors (FETs), although physically very different in their modes of operation from tubes, can be classified in much the same manner as that originally conceived for vacuum tube amplifiers.

Over the last few years, there has been a rapid growth in a type of consumer electronic products that use RF amplifiers and are generally referred to as personal communications service products. The cellular telephone is an example of such a product. Originally, cellular telephone service was intended for use in automobiles. More recently, the product is made as a small, even pocket-sized unit that a person can conveniently carry with them.

In order to reduce the size and weight of the units, the weight and size of the battery must also be reduced, while maintaining the time between battery replacement or recharge. One avenue is to make smaller, higher capacity batteries. Presently, the most effective batteries for these products have voltage outputs in the range of 1 to 3 volts. Circuitry designed to work with these small voltages also tend to be smaller and lighter.

The size of the units can also be made smaller and lighter by making the internal circuits more efficient and capable of operating at the reduced voltages. In a typical product, most of the power is consumed by the transmitter output amplifier, which typically boosts the telephone voice signal from about a 1 milliwatt level to a maximum power level, usually one-half to one watt. Any improvement in efficiency of the output amplifier results directly in a corresponding extension of the battery lifetime, thereby improving the market potential of the product.

A basic RF amplifier uses an active device, such as a tube, BJT or FET. The device is responsive to a low-level input control signal applied to a control terminal to cause a flow of current from a DC supply, such as a battery, through the active device. If a load resistance of a suitable value is placed in series with the DC supply, an amplified replica of the input signal appears across the load resistor. The active device typically has a range of input control voltage over which the supply current can be controlled in an approximately linear fashion. This range is typically from near zero to a maximum value, $I_{max}$. For maximum linear power output, then, the drain current swings between zero and $I_{max}$, and the device voltage swings between zero and $V_{dc}$, the supply voltage.

The efficiency of such basic, linear amplifiers is very low. The class A amplifier improves on the efficiency of the basic amplifier by providing a separate, low resistance path for the DC component of current. This is typically achieved using a high reactance choke which presents a very high impedance to the RF signals, but allows DC to pass with negligible resistance.

Assuming the active device is an FET, a DC bias equal to half the cutoff point, referred to as the pinchoff voltage, is applied to the control terminal or gate. The current through the active device again varies between zero and $I_{max}$, but the RF voltage varies from zero to 2 $V_{dc}$. Such a device then has a drain efficiency (RF power/DC power) of 50%. Thus, although it is a linear amplifier, half of the DC power supplied is dissipated as heat in the active device.

A class B amplifier increases the efficiency further. With this class of amplifier, the gate is biased near the cutoff point so that conduction only occurs for a fraction of the whole RF cycle. If the input signal is increased sufficiently, or a device with a sufficiently low pinchoff is selected, the drain current still swings to $I_{max}$ in about a half sine wave.

The output current and voltage waveforms are not exact replicas of the input signal waveforms. However, the output signals contain non-fundamental frequency components that can be filtered out. Thus, the classical Class B mode amplifier incorporates a "tank" circuit in parallel with the load resistor. The components of the tank circuit are selected to short-circuit the harmonic components of current. Only the fundamental component of current is allowed to flow through the RF load resistor. The drain efficiency of the amplifier is thereby $\pi/4$ or 78%.

Further improvement in efficiency is obtained by biasing the gate well beyond pinchoff, in what is termed a Class C mode. However, as the conduction angle is reduced and the efficiency theoretically approaches 100%, the fundamental RF power output decreases in comparison to the Class B or Class A conditions.

Other techniques are also well known for obtaining improved power and/or efficiency. These include non-zero harmonic impedance terminations and/or higher, overdriven input levels. These improvements are summarized by D. M. Snider in an article entitled "A Theoretical Analysis and Experimental Confirmation of the Optimally Loaded and Overdriven RF Power Amplifier", *IEEE Trans. Electron Devices*, Vol. ED-14, No. 12, Dec. 1967, pp. 851-857. They do not constitute fundamentally different modes of operation, although certain specific cases have been named as Classes D-F.

For instance, Sokal et al., in U.S. Pat. No. 3,919,656, discloses a distinctive high-efficiency mode amplifier that has been termed a Class E amplifier. It consists of a heavily overdriven active device which acts more like a switch than a linear current control. The load network is synthesized such that the RF voltage and current are never non-zero simultaneously. This gives a very high DC to RF conversion efficiency.

These high-efficiency RF amplifiers are characterized by several features. One is that the RF current flow in the active device has a zero value for a significant portion of the RF cycle, causing a reduction in DC power with minimal reduction in RF power. Another is that the RF voltage waveform at the output terminal of a current-source (as opposed to switch mode) active device is sinusoidal, or symmetrical, about the DC supply voltage. Also, the quiescent or average (direct) current drawn by the device is low under conditions of low or zero RF drive. As the RF drive is increased, the DC increases.

The voltage symmetry feature of conventional high efficiency modes becomes a serious limitation for practical implementation when the DC supply voltage is low ("Low" is here interpreted as being of the same order of magnitude as the turn-on, or "knee" voltage of the device). There is therefore a need for an RF amplifier having a high efficiency mode of operation that generates an RF voltage which is several times (rather than just two times) the DC supply, and is therefore well suited to low voltage supply applications.

SUMMARY OF THE INVENTION

The present invention satisfies this need with an RF amplifier that is operative with input drive levels similar to the Class A condition, resulting in higher power gain. The present invention also provides an RF amplifier that provides linear signal amplification at small signal levels.

In general terms, the present invention includes an active device, such as an FET, having an output terminal and a maximum output current through the output terminal. A power supply supplies DC power at a supply voltage to the active device. An input network operates the active device with a quiescent current closer to the maximum output current than to zero current. An output network couples the active device to the load and is characterized as having a low impedance at a fundamental frequency and a high impedance lower than an open circuit impedance at at least the second harmonic frequency. As a result, the peak voltage on the output terminal is greater than two times the supply voltage.

In the preferred embodiment of the invention, the active device is a GaAs FET. A preamplifier raises the level of the input signal so that it has a positive voltage peak when biased by the input network and applied to the input terminal. This overdrives the FET and produces an output current that is at the maximum output current level for a longer time during each cycle than the output current is at a minimum level. This enhances the effect of the output network to produce a peak output voltage on the FET that is several times the DC voltage. Power efficiencies during signal transmission through the amplifier potentially as high as 80% are thereby realizable.

Since this amplifier has relatively high quiescent current level, it is inefficient if used continuously in communication systems producing signals intermittently. In order to accommodate use of the amplifier in such situations, it may be made part of an amplifier system that also includes a switch coupled between the DC supply and the FET that is responsive to a control signal. A circuit is responsive to the input signal for generating the control signal appropriate for disconnecting the DC voltage supply from the FET when there is no input signal. This prevents power loss when it is not being used for communication. The high efficiencies realized during signal transmission periods are applicable then to the overall amplifier system.

These and other features and advantages of the present invention will be apparent from the following detailed description of the preferred embodiment of the invention also illustrated in the accompanying drawings.

BRIEF DESCRIPTION OF THE DRAWINGS

FIG. 5 is a circuit schematic of a preferred embodiment of the invention.

FIG. 6 is a block diagram of an amplifier system incorporating the amplifier of FIG. 5.

DETAILED DESCRIPTION OF THE PREFERRED EMBODIMENT

Figure 1:
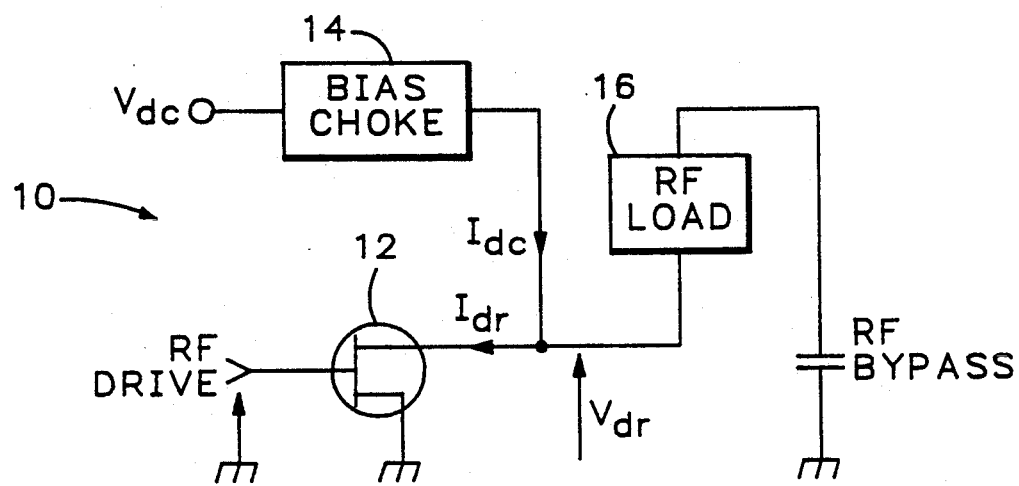
FIG. 1 is a general diagram of a basic FET amplifier identifying relevant currents and voltages.

Referring initially to FIG. 1, a basic FET-based amplifier 10 is shown. The amplifier includes an FET 12 having a drain current $I_d(t)$ which comprises a DC component $I_{dc}$ and sinusoidal components $$I_1 \cos \omega t, I_2 \cos 2\omega t, I_3 \cos 3\omega t, \ldots$$

Figure 2:
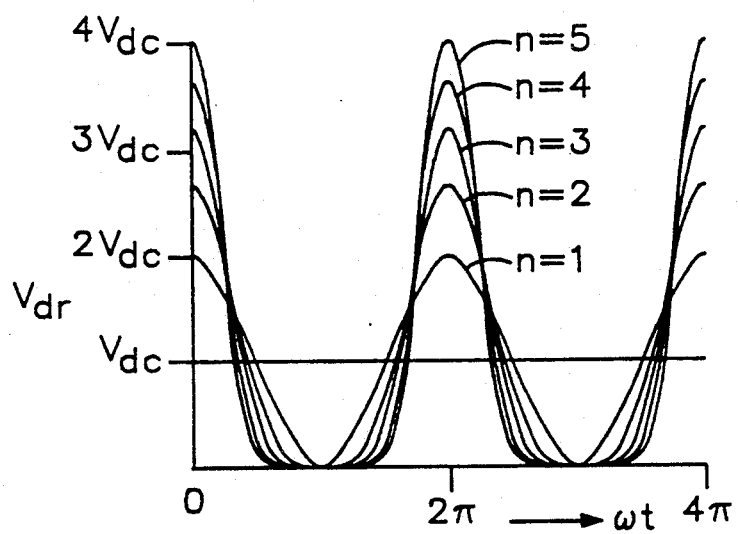
FIG. 2 illustrates various drain voltage waveforms realizable in an amplifier made according to the invention.

Note that the bias choke 14 in amplifier 10 enables the DC component of current to flow directly into the device, without passing through the RF load 16. A quantitative analysis of the high efficiency mode of operation of amplifier 10 according to the invention can be performed by modeling the FET signal waveforms using a suitable mathematical describing function. A suitable describing function for the drain voltage $V_{dr}$ of FET 12 is $$V_{dr} = V_{pk} \left( \frac{(1 + \cos\omega t)^n}{2^n} \right) \tag{1}$$

where $V_{pk}$ is the peak drain voltage, and n is a parameter which determines a) the "sharpness" of the voltage waveform, and b) the precise number of harmonics contained in a Fourier analysis of the waveform. This function has the advantage of having a finite, minimum number of harmonics, so that the corresponding device current waveform can be easily determined by either time domain or frequency domain considerations. Selection of a value for n determines the number of harmonic terminations which the circuit design has to include. FIG. 2 illustrates various waveforms for $V_{dr}$. It is seen that as the parameter n increases in value, the sharpness of the waveform associated with $V_{pk}$ increases.

An important relationship for this analysis can be derived by determining the mean value of the voltage function, and equating this to the DC supply voltage, $V_{dc}$. This equality ensures that the chosen voltage function will always give a value which remains above or equal to zero:

$$V_{dc} = \frac{V_{pk}}{2\pi 2^n} \int_0^{2\pi} (1 + \cos\omega t)^n d\omega t$$

Evaluation of this integral gives a relationship between the peak voltage and the DC supply voltage as a function of n. The first harmonic (fundamental) amplitude component $V_1$ can also be evaluated by evaluating the appropriate Fourier series integral. The first few values are as shown in Table I.

TABLE I

| n | $V_{pk}/V_{dc}$ | $V_1/V_{peak}$ |
|---|---|---|
| 1 (sinewave) | 2 | 1/2 |
| 2 | 8/3 (2.667) | 1/2 |
| 3 | 16/5 (3.2) | 15/32 |
| 4 | 128/35 (3.657) | 7/16 |
| 5 | 256/63 (4.063) | 105/256 |

The voltage waveforms shown in FIG. 2 can be generated by an amplifier having an appropriate output network with an impedance $Z_n$ at the nth harmonic frequency. By assuming a suitable current waveform, the appropriate values of $Z_n$ are determined using equation (1) to match up with the Fourier components of the desired voltage waveform, such as the waveform shown in FIG. 3a for n=5. The DC and fundamental components of current and voltage can all be determined by suitable expansion or Fourier integration of equation (1).

The most simple case consists of a broadband resistive termination, where $$Z_1 = Z_2 = Z_3 = \ldots = R_L$$

Figure 3A:
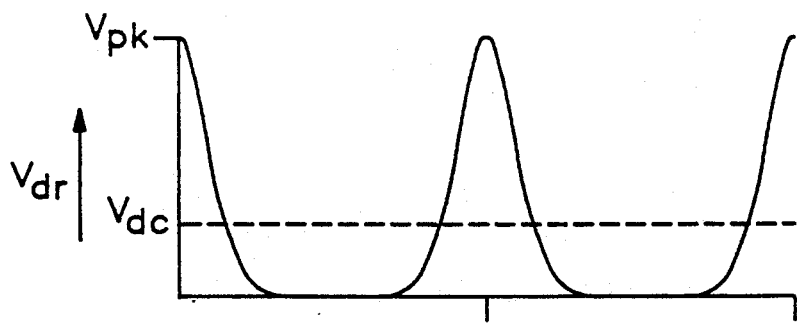
FIGS. 3a and 3b illustrate drain voltage and current waveforms, respectively, realizable when the FET in the amplifier of FIG. 1 is overdriven.
Figure 3B:
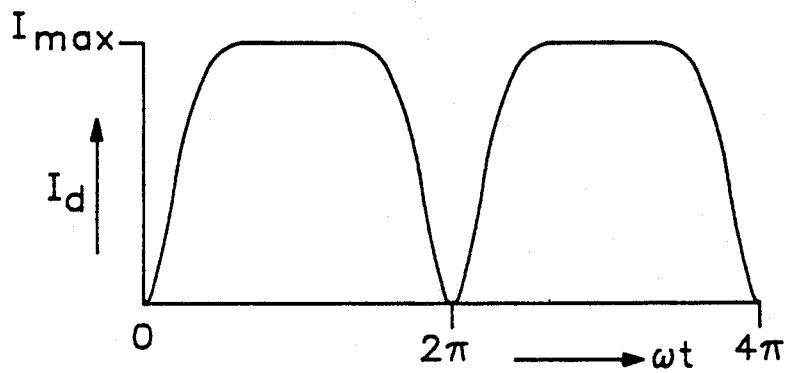

In this case the necessary current waveform as shown in FIG. 3b is a mirrored replica of the voltage waveform, where $$V_{pk} = I_{max} R_L$$

This simple case will not yield a very efficient amplifier due to the high mean value of current. It is important to note, however, that the general form of the current shown in FIG. 3b is realizable in a practical situation by biasing the gate of the FET device close to its saturation (open channel) condition ($V_g$ near zero) and applying a sinusoidal RF excitation which pinches the device off for a small fraction of each cycle.

Figure 4A:
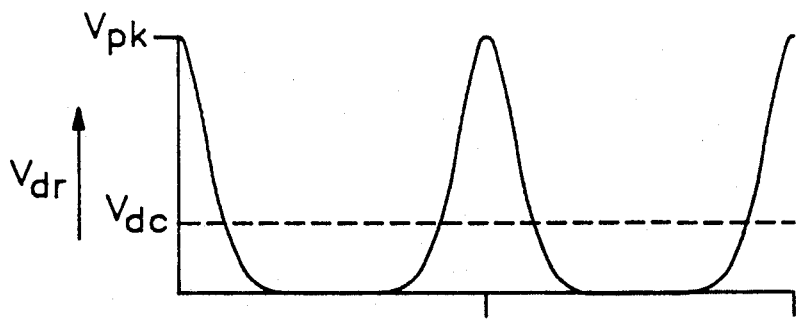
FIGS. 4a and 4b illustrate drain voltage and current waveforms realizable in an amplifier made according to the invention.
Figure 4B:
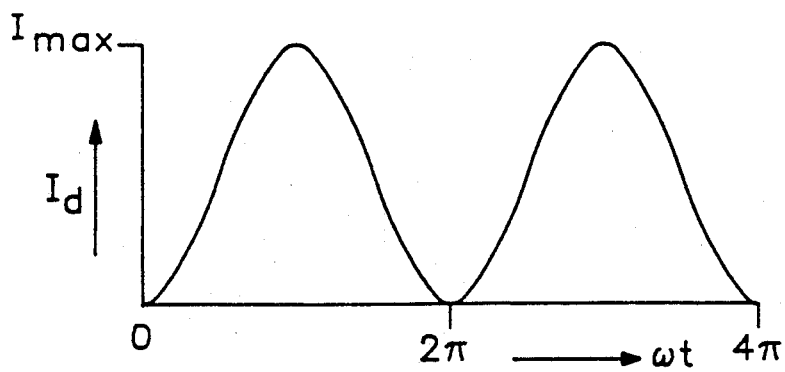

The same voltage waveform shown in FIG. 3a can be generated by scaling down the magnitudes of the current harmonic components $I_n$ and scaling up the resistive terminations $Z_n$ by the same factor. In the limiting case, it can be assumed that the current waveform can be so close to a sinewave that the harmonic components $I_2$, $I_3$, etc. are negligible for the purposes of estimating the mean value of the DC supply to the device, but the magnitudes of the harmonic terminations can be made high enough to generate the necessary harmonics to give the same voltage waveform as shown in FIG. 3a; this situation is shown in FIGS. 4a and 4b. The efficiency of such a configuration can be easily calculated, since the DC supply can be assumed to be very close to half the peak current. Table II below shows the various relative voltage and power values and resulting efficiencies for n=1, 2, 3 and 4.

TABLE II

| n | $I_1$ | $I_{dc}$ | $V_{pk}$ | $V_1$ | Pwr(DC) | Pwr(Fund) | η |
|---|---|---|---|---|---|---|---|
| 1 | $\frac{I_{max}}{2}$ | $\frac{I_{max}}{2}$ | $2V_{dc}$ | $V_{dc}$ | $V_{dc}\frac{I_{max}}{2}$ | $\frac{1}{2}V_{dc}\frac{I_{max}}{2}$ | $\frac{1}{2}$ (50%) |
| 2 | $\frac{I_{max}}{2}$ | $\frac{I_{max}}{2}$ | $\frac{8}{3}V_{dc}$ | $\frac{1}{2}\frac{8}{3}V_{dc}$ | $V_{dc}\frac{I_{max}}{2}$ | $\frac{1}{2}\frac{4}{3}V_{dc}\frac{I_{max}}{2}$ | $\frac{2}{3}\left(66\frac{2}{3}\%\right)$ |
| 3 | $\frac{I_{max}}{2}$ | $\frac{I_{max}}{2}$ | $\frac{16}{5}V_{dc}$ | $\frac{15}{32}\frac{16}{5}V_{dc}$ | $V_{dc}\frac{I_{max}}{2}$ | $\frac{1}{2}\frac{3}{2}V_{dc}\frac{I_{max}}{2}$ | $\frac{3}{4}$ (75%) |
| 4 | $\frac{I_{max}}{2}$ | $\frac{I_{max}}{2}$ | $\frac{128}{35}V_{dc}$ | $\frac{7}{16}\frac{128}{35}V_{dc}$ | $V_{dc}\frac{I_{max}}{2}$ | $\frac{1}{2}\frac{8}{5}V_{dc}\frac{I_{max}}{2}$ | $\frac{4}{5}$ (80%) |

As n increases, it can be seen that the efficiency increases, along with a higher peak voltage. In general it can be shown that for n harmonics terminated in this manner, the efficiency is $$\eta_n = \frac{n}{n+1}$$

The values in Table II are based on some simplifying assumptions which enable a closed form mathematical analysis to be performed. It should be emphasized that the limiting case of a sinusoidal current waveform with vanishingly small harmonic components and very high resistive harmonic loads would not be realizable in practice. A realistic harmonic to fundamental ratio would increase the DC component of current from the $I_{max}/2$ values given in the third column of Table II, which would cause a corresponding decrease in the efficiency values in the righthand column. The actual embodiment of this invention shown in FIG. 5 was designed for the n=2 case and has demonstrated drain efficiencies in the range of 65 to 70%.

In practice, the cases of most interest are n=2 and n=3, which probably represent the practical limit for realization of the necessarily high Q matching circuits to generate the high harmonic impedance terminations.

A simple quantitative analysis confirms the existence of hitherto unknown high efficiency modes, which use high impedance harmonic terminations to generate sharply peaked, non-sinusoidal voltage waveforms which yield high efficiency and high linearity simultaneously. In order to obtain maximum efficiency, the device is biased to give slight asymmetry with respect to its saturation (open channel) current and the pinchoff point; the asymmetry is weighted towards the saturation point to give the correct phasing of low level harmonics in the current waveform. The higher the harmonic impedances, the less the required asymmetry in the biasing of the device. This tradeoff has been observed in measurements made on the practical embodiment described herein.

FIG. 5 shows a schematic diagram of an amplifier 20 made according to the invention. Amplifier 20 has an active device Q1 that is a GaAsFET having approximately 5 millimeter gate periphery. An input matching network 22, comprising shunt and series inductors $L_1$ (1.5 nH) and $L_2$ (0.5 nH), matches the very low impedance GaAsFET input impedance to a 50 Ohm system environment. A capacitor $C_1$ (30 pF) blocks DC current. A negative gate bias $V_g$ is fed into the FET gate through $L_1$, which has an RF ground provided by a bypass capacitor $C_2$ (30 pF).

A drain circuit matching network 24 is considerably more complex than the input network, and contains several reactive elements $L_3$ (1 nH), $T_1$ (L (length)=450 mil, $Z_0$=50 Ω), $C_4$ (3 pF), and $C_5$ (0.2 pF), which together with the drain capacitance of the GaAsFET provide fundamental and harmonic terminations as described in the previous section for a parameter value of n=2 and a fundamental frequency of about 2 GHz. The primary matching elements are the drain capacitance (1 pF), the inductor $L_3$ and the shunt capacitor $C_4$. These elements form a "pi" section, which can be shown, by conventional passive circuit analysis, to present a real impedance of approximately 10 Ohms at the fundamental frequency, and a high resistive impedance of approximately 200 Ohms at the second harmonic frequency. The transmission line $T_1$ and capacitor $C_5$ are small tuning elements for optimizing higher harmonic terminations and fundamental power output. Like capacitor $C_1$, capacitor $C_6$ blocks direct current flow.

Amplifier 20 provides +28 dBm output power at a drain efficiency of up to 70% for a DC drain bias, $V_{dc}$, of 3 volts, at a frequency of 1900 MHz. This is both higher power and efficiency than could be achieved simultaneously using the same active device in conventional high efficiency modes.

As has been mentioned, amplifier 20 is particularly useful in a communication system in which the signal is intermittent or continuous. FIG. 6 illustrates an amplifier system 30 for use with intermittent or pulsed RF signals. Amplifier 20 includes input and output matching networks 22 and 24, a control bias 32 corresponding to $V_g$, active device 34 corresponding to FET $Q_1$, and DC supply 36 corresponding to $V_{dc}$. Additionally, a switch 38 connects the DC supply to the active device through the output network, as is shown in FIG. 5. Switch 38 is controlled by a control signal generated by a signal sensor 40 that couples the RF signal received from a signal source to a preamp 42. When an input signal is present, sensor 40 closes switch 38. Correspondingly, when there is no input signal, the switch is opened. In this way, there is no DC current drain when no signal is present and the amplifier efficiency can be realized overall. The preamp simply boosts the input signal sufficiently to overdrive the FET slightly, as discussed above.

This new mode of amplifier operation is in some respects complementary to conventional reduced conduction angle modes, in terms of reversed roles of voltage and current. In a conventional high efficiency mode, the device RF current has a pulse-like, or peaked waveform, while the voltage remains sinusoidal. In the new mode, the voltage waveform is peaked and the current is approximately sinusoidal. The complementary nature of the current and voltage waveforms is not complete, however; in the new mode the peak voltage may be many times higher than the supply voltage $V_{dc}$, and the current cannot be perfectly sinusoidal for the mode to be practically realizable.

The device is biased the opposite way to a conventional reduced angle mode, such that the device is drawing closer to $I_{max}$ under conditions of no RF drive. This causes an "inverted peaking" of the RF current waveform, where the current is at a high value for more of the cycle than it is low (zero). With suitable choice of terminations at harmonic frequencies, such a current waveform causes a highly peaked RF waveform, whose peak value can be many times the DC supply level. With suitable harmonic voltage magnitudes, the voltage pulses can occur almost entirely while the current is at a low value, so that high DC to RF conversion is possible.

This mode can give efficiencies above 80%, but has the major advantage of operating at low values of mean (DC supply) voltage. There are other advantages of this mode: 1) the mode can be operative with input drive levels similar to the Class A condition (higher power gain); 2) an amplifier operating in this mode gives normal linear gain at small signal levels; 3) with carefully controlled harmonic terminations, amplifiers with enhanced efficiency (significantly greater than 50%) can be built which have odd order nonlinearities at the same levels as a conventional Class A amplifier using the same device. This feature is of great importance in multi-carrier communications systems which are limited by intermodulation distortion.

The distinctive features of the new mode can be summarized as follows: 1) High quiescent current, due to the DC bias point being closer to $I_{max}$ (open channel) than to zero (pinchoff); 2) DC drops as the RF drive is increased; 3) There is a highly peaked RF voltage waveform at the active device output terminal having a peak value many times greater than the DC supply voltage; and 4) High, but finite, harmonic impedance terminations for both even and odd harmonics.

It will thus be apparent to one skilled in the art that variations in form and detail may be made in the preferred embodiment without varying from the spirit and scope of the invention as defined in the claims and any modification of the claim language or meaning as provided under the doctrine of equivalents. The preferred embodiment is thus provided for purposes of explanation and illustration, but not limitation.

I claim:

1. A high efficiency power amplifier system for amplifying radio frequency (RF) signals from a signal source at a fundamental frequency and coupling the amplified signal to a load, comprising:
   an active device having an output terminal and a maximum output current through the output terminal;
   means for supplying DC power at a supply voltage to the active device;
   means for operating the active device with a quiescent current closer to the maximum output current than to zero current; and
   an output network for coupling the active device to the load, and having a low impedance to ground at a fundamental frequency and a high impedance to ground lower than an open circuit impedance at at least the second harmonic frequency, whereby the peak voltage on the output terminal is greater than two times the supply voltage.

2. An amplifier system according to claim 1 wherein the active device also has an input terminal, the amplifier system further comprising means responsive to a signal received from the signal source for amplifying the received signal to have a positive voltage peak when applied to the input terminal sufficient to produce an output current passing through the output terminal that is at the maximum output current level for a longer time during each cycle than the output current is at a minimum level.

3. An amplifier system according to claim 1 where the signal source generates the RF signal intermittently, the amplifier system further comprising switch means coupled between the DC supply and the active device, the switch means being responsive to a control signal, and means responsive to the input signal for generating the control signal appropriate for disconnecting the DC voltage supply from the active device when there is no input signal, whereby the active device does not conduct current when no input signal is received on the input terminal.

4. A high efficiency power amplifier system for amplifying sinusoidal radio frequency (RF) signals from a signal source at a fundamental frequency and coupling the amplified signal to a load, comprising:

an active device having an output terminal and a maximum output current through the output terminal;

means for supplying DC power at a supply voltage to the active device;

means for operating the active device with a quiescent current closer to the maximum output current than to zero current; and an output network coupling the active device to the load, and having a low impedance to ground at a fundamental frequency;

the operating means and output network being appropriate for producing a voltage on the output terminal of the active device characterized by a sufficient presence of harmonic frequencies to produce a peak voltage greater than two times the supply voltage.

5. An amplifier according to claim 4 wherein the current through the output terminal has less non-fundamental harmonic frequency content than the voltage on the output terminal.

* * * * *